United States Patent
Wang et al.

(10) Patent No.: US 8,628,645 B2
(45) Date of Patent: Jan. 14, 2014

(54) MANUFACTURING METHOD FOR THIN FILM BATTERY

(75) Inventors: Weng-Chung Wang, Rowland Heights, CA (US); Kai-Wei Nieh, Monrovia, CA (US)

(73) Assignee: Front Edge Technology, Inc., Baldwin Park, CA (US)

( * ) Notice: Subject to any disclaimer, the term of this patent is extended or adjusted under 35 U.S.C. 154(b) by 1128 days.

(21) Appl. No.: 11/849,959

(22) Filed: Sep. 4, 2007

(65) Prior Publication Data

US 2009/0057136 A1 Mar. 5, 2009

(51) Int. Cl.
C23C 14/00 (2006.01)
C23C 14/32 (2006.01)
C25B 9/00 (2006.01)
C25B 11/00 (2006.01)
C25B 13/00 (2006.01)

(52) U.S. Cl.
USPC ............ 204/192.15; 204/192.12; 204/298.08; 204/298.12; 204/298.13; 204/298.16

(58) Field of Classification Search
USPC ............... 204/192.12, 192.15, 192.3, 298.08, 204/298.12, 298.13, 298.16
See application file for complete search history.

(56) References Cited

U.S. PATENT DOCUMENTS

| | | | |
|---|---|---|---|
| 3,375,135 A | 3/1968 | Moulton et al. | |
| 3,414,685 A | 12/1968 | Geib et al. | |
| 3,530,007 A | 9/1970 | Golubovic | |
| 3,844,841 A | 10/1974 | Baker | |
| 3,969,142 A | 7/1976 | Greatbatch et al. | |
| 3,993,508 A | 11/1976 | Erlichman | |
| 4,119,769 A | 10/1978 | Schneider et al. | |
| 4,309,494 A | 1/1982 | Stockel | |
| 4,421,835 A | 12/1983 | Manassen et al. | |
| 4,459,328 A | 7/1984 | Mizuhara | |
| 4,543,441 A | 9/1985 | Kumada et al. | |
| 4,565,753 A | 1/1986 | Goebel et al. | |
| 4,597,844 A | 7/1986 | Hiraki et al. | |
| 4,619,865 A | 10/1986 | Keem et al. | |
| 4,663,183 A | 5/1987 | Ovshinsky et al. | |

(Continued)

FOREIGN PATENT DOCUMENTS

CN 1661354 A 8/2005
EP 0 829 913 A 3/1998

(Continued)

OTHER PUBLICATIONS

Krasnov et al., U.S. Appl. No. 11/946,819, "Thin Film Battery Comprising Stacked Battery Cells and Method", filed Nov. 28, 2007.

(Continued)

Primary Examiner — Michael Band
(74) Attorney, Agent, or Firm — Ashok K. Janah; Janah & Associates, P.C.

(57) ABSTRACT

A thin film battery manufacturing method is provided for deposition of lithium metal oxide films onto a battery substrate. The films are deposited in a sputtering chamber having a plurality of sputtering targets and magnetrons. The sputtering gas is energized by applying a voltage bias between a pair of the sputtering targets at a frequency of between about 10 and about 100 kHz. The method can provide a deposition rate of lithium cobalt oxide of between about 0.2 and about 4 microns/hr with improved film quality.

16 Claims, 6 Drawing Sheets

(56) References Cited

U.S. PATENT DOCUMENTS

| | | | |
|---|---|---|---|
| 4,698,256 A | 10/1987 | Giglia et al. | |
| 4,714,660 A | 12/1987 | Gates, Jr. | |
| 4,725,345 A | 2/1988 | Sakamoto et al. | |
| 4,777,090 A | 10/1988 | Ovshinsky et al. | |
| 4,871,433 A | 10/1989 | Wagner et al. | |
| 4,873,115 A | 10/1989 | Matsumura et al. | |
| 4,877,677 A | 10/1989 | Hirochi et al. | |
| 4,904,542 A | 2/1990 | Mroczkowski | |
| 4,996,079 A | 2/1991 | Itoh | |
| 5,019,467 A | 5/1991 | Fujiwara | |
| 5,171,413 A | 12/1992 | Arntz et al. | |
| 5,197,889 A | 3/1993 | Rizzo et al. | |
| 5,240,794 A | 8/1993 | Thackeray et al. | |
| 5,249,554 A | 10/1993 | Tamor et al. | |
| 5,262,028 A | 11/1993 | Manley | |
| 5,330,853 A | 7/1994 | Hofmann et al. | |
| 5,338,625 A | 8/1994 | Bates et al. | |
| 5,368,939 A | 11/1994 | Kawamura et al. | |
| 5,445,906 A | 8/1995 | Hobson et al. | |
| 5,478,456 A | 12/1995 | Humpal et al. | |
| 5,490,911 A | 2/1996 | Makowiecki et al. | |
| 5,498,490 A | 3/1996 | Brodd | |
| 5,503,912 A | 4/1996 | Setoyama et al. | |
| 5,511,587 A | 4/1996 | Miya et al. | |
| 5,512,147 A | 4/1996 | Bates et al. | |
| 5,512,387 A | 4/1996 | Ovshinsky | |
| 5,516,340 A | 5/1996 | Takeuchi et al. | |
| 5,547,767 A | 8/1996 | Paidassi et al. | |
| 5,552,242 A | 9/1996 | Ovshinsky et al. | |
| 5,554,456 A | 9/1996 | Ovshinsky et al. | |
| 5,597,660 A | 1/1997 | Bates et al. | |
| 5,612,152 A | 3/1997 | Bates et al. | |
| 5,656,364 A | 8/1997 | Rickerby et al. | |
| 5,670,252 A | 9/1997 | Makowiecki et al. | |
| 5,670,272 A | 9/1997 | Cheu et al. | |
| 5,700,551 A | 12/1997 | Kukino et al. | |
| 5,705,293 A | 1/1998 | Hobson | |
| 5,705,297 A | 1/1998 | Warren | |
| 5,786,582 A | 7/1998 | Roustaei et al. | |
| 5,814,195 A * | 9/1998 | Lehan et al. | 204/192.12 |
| 5,824,374 A | 10/1998 | Bradley, Jr. et al. | |
| 5,871,865 A | 2/1999 | Barker et al. | |
| 5,894,656 A | 4/1999 | Menon et al. | |
| 5,961,672 A | 10/1999 | Skotheim et al. | |
| 5,985,485 A | 11/1999 | Ovshinsky et al. | |
| 6,017,654 A | 1/2000 | Kumta et al. | |
| 6,022,640 A | 2/2000 | Takada et al. | |
| 6,039,850 A * | 3/2000 | Schulz | 204/192.15 |
| 6,051,114 A * | 4/2000 | Yao et al. | 204/192.3 |
| 6,118,248 A | 9/2000 | Gartstein et al. | |
| 6,148,503 A | 11/2000 | Delnick et al. | |
| 6,168,884 B1 | 1/2001 | Neudecker et al. | |
| 6,197,450 B1 | 3/2001 | Nathan et al. | |
| 6,217,623 B1 | 4/2001 | Reichert et al. | |
| 6,218,049 B1 | 4/2001 | Bates et al. | |
| 6,242,129 B1 | 6/2001 | Johnson | |
| 6,264,709 B1 | 7/2001 | Yoon et al. | |
| 6,280,875 B1 | 8/2001 | Kwak et al. | |
| 6,287,711 B1 | 9/2001 | Nieh et al. | |
| 6,340,880 B1 | 1/2002 | Higashijima et al. | |
| 6,365,010 B1 * | 4/2002 | Hollars | 204/192.12 |
| 6,379,835 B1 | 4/2002 | Kucherovsky et al. | |
| 6,387,039 B1 | 5/2002 | Moses | |
| 6,387,563 B1 | 5/2002 | Bates | |
| 6,398,824 B1 | 6/2002 | Johnson | |
| 6,402,796 B1 | 6/2002 | Johnson | |
| 6,411,780 B1 | 6/2002 | Maruyama | |
| 6,517,968 B2 | 2/2003 | Johnson | |
| 6,558,836 B1 | 5/2003 | Whitacre et al. | |
| 6,632,563 B1 | 10/2003 | Krasnov et al. | |
| 6,636,017 B2 | 10/2003 | Zink et al. | |
| 6,645,658 B2 | 11/2003 | Morozumi | |
| 6,658,124 B1 | 12/2003 | Meadows | |
| 6,661,197 B2 | 12/2003 | Zink et al. | |
| 6,713,987 B2 | 3/2004 | Krasnov et al. | |
| 6,863,699 B1 | 3/2005 | Krasnov et al. | |
| 6,921,464 B2 | 7/2005 | Krasnov et al. | |
| 6,940,988 B1 | 9/2005 | Shennib et al. | |
| 7,037,621 B2 | 5/2006 | Kikuchi et al. | |
| 7,056,620 B2 | 6/2006 | Krasnov et al. | |
| 7,186,479 B2 | 3/2007 | Krasnov et al. | |
| 7,286,479 B2 | 10/2007 | Bragg | |
| 2001/0041294 A1 | 11/2001 | Chu et al. | |
| 2002/0004167 A1 | 1/2002 | Jenson et al. | |
| 2002/0028384 A1 | 3/2002 | Krasnov et al. | |
| 2002/0071989 A1 | 6/2002 | Verma et al. | |
| 2002/0110733 A1 | 8/2002 | Johnson | |
| 2002/0150823 A1 | 10/2002 | Breitkopf et al. | |
| 2003/0121142 A1 | 7/2003 | Kikuchi et al. | |
| 2003/0152829 A1 | 8/2003 | Zhang et al. | |
| 2003/0160589 A1 | 8/2003 | Krasnov et al. | |
| 2004/0018424 A1 | 1/2004 | Zhang et al. | |
| 2004/0064937 A1 | 4/2004 | Krasnov et al. | |
| 2004/0086762 A1 | 5/2004 | Maeda et al. | |
| 2004/0175609 A1 | 9/2004 | Yageta et al. | |
| 2004/0178057 A1 * | 9/2004 | Leu et al. | 204/192.15 |
| 2005/0079418 A1 | 4/2005 | Kelley et al. | |
| 2005/0130032 A1 | 6/2005 | Krasnov et al. | |
| 2005/0156573 A1 | 7/2005 | Lin | |
| 2006/0040169 A1 | 2/2006 | Liu et al. | |
| 2006/0040170 A1 | 2/2006 | Liu et al. | |
| 2006/0068258 A1 | 3/2006 | Kinoshita | |
| 2006/0115706 A1 | 6/2006 | Maeda et al. | |
| 2006/0134522 A1 * | 6/2006 | Zhang et al. | 429/231.3 |
| 2006/0216589 A1 | 9/2006 | Krasnov et al. | |
| 2007/0037054 A1 | 2/2007 | Kikuchi et al. | |
| 2007/0047750 A1 | 3/2007 | Sauer et al. | |
| 2007/0047796 A1 | 3/2007 | Anantharaman | |
| 2007/0104343 A1 | 5/2007 | Bengtsson et al. | |
| 2007/0104344 A1 | 5/2007 | Goldberg | |
| 2007/0125638 A1 | 6/2007 | Zhang et al. | |
| 2007/0141460 A1 | 6/2007 | You et al. | |
| 2007/0166612 A1 | 7/2007 | Krasnov et al. | |
| 2008/0213664 A1 | 9/2008 | Krasnov et al. | |
| 2008/0217162 A1 * | 9/2008 | Delrue et al. | 204/192.15 |
| 2008/0263855 A1 | 10/2008 | Li et al. | |
| 2009/0010462 A1 | 1/2009 | Ekchian et al. | |
| 2010/0028767 A1 | 2/2010 | Inose et al. | |

FOREIGN PATENT DOCUMENTS

| | | | |
|---|---|---|---|
| EP | 1 458 037 A | | 9/2004 |
| FR | 2 403 652 A | | 4/1979 |
| GB | 2251119 A | | 6/1992 |
| JP | 59-032023 A | | 2/1984 |
| JP | 59-226472 A | | 12/1984 |
| JP | 60-072168 | | 4/1985 |
| JP | 61195563 A | | 8/1986 |
| JP | 04295015 A | * | 10/1992 |
| JP | 09-259929 A | | 10/1997 |
| JP | 2001-044073 A | | 2/2001 |
| JP | 2003-249199 A | | 9/2003 |
| JP | 2009123516 | | 6/2009 |
| WO | WO-95/14311 A | | 5/1995 |
| WO | WO-99/23714 | | 5/1999 |
| WO | WO-00/60689 A | | 10/2000 |
| WO | WO-01/73873 A | | 10/2001 |
| WO | WO-02/21627 A3 | | 3/2002 |
| WO | WO-02/42516 A3 | | 5/2002 |
| WO | WO-03/005477 A3 | | 1/2003 |
| WO | WO-03/061049 A | | 7/2003 |
| WO | WO-03/073531 A3 | | 12/2003 |
| WO | WO-2006/105050 A3 | | 10/2006 |
| WO | WO-2006/105188 A1 | | 10/2006 |
| WO | WO 2007042394 A1 | * | 4/2007 |
| WO | WO2008101254 | | 8/2008 |
| WO | WO-2008/108999 A3 | | 11/2008 |
| WO | WO-2008/134053 A1 | | 11/2008 |

OTHER PUBLICATIONS

Nieh et al., U.S. Appl. No. 12/032,997, "Thin Film Battery Fabrication Using Laser Shaping", filed Feb. 18, 2008.

(56) References Cited

OTHER PUBLICATIONS

PCT International Search Report in Application No. PCT/US2008/013213 (WO 2009/073150 Al), mailed Jun. 18, 2009.

Bates et al., "Preferred orientation of polycrystalline LiCoO2 films" J. of the Electrochemical Society (2000), pp. 59-70, Issue No. 147 (1).

Roh et al., "Effects of deposition condition on the ionic conductivity . . . " Scripta Materialia, Dec 17, 1999, pp. 43-49, vol. 42. No. 1, New York, NY.

Bolster et al., "Investigation of lithium intercalation metal oxides for thermalbatteries" Proceedings of the 34th Int'l Power Source Symposium, Jun. 25-28, 1990, pp. 136-140.

Wagner et al., "Fabrication and Testing of thermoelectric thin film devices" 15th Int'l Conf. on Thermoelectrics, Mar. 26-29, 1996, pp. 269-273.

Neudecker et al., "Lithium-Free Thin-Film Battery . . . " Journal of the Electrochemical Society (2000), pp. 517-523, Issue No. 147 (2).

Park et al., "Characterization of tin oxide/LiMn2O4 thin-film cell," Journal of Power Sources, Jun. 2000, pp. 250-254, vol. 88, No. 2, Elsevier Science S.A.

Yang et al., "Effect of annealing temperature on structure and electrochemical properties of $LiCoO_2$ cathode thin films", Rare Metals, vol. 25, Dec. 2006, pp. 189-192.

Mattox, Donald M., Handbook of Physical Vapor Deposition (PVD) Processing, Film Formation, Adhesion, Surface Preparation and Contamination Control, 1998, pp. 127-135 and 343-364, Noyes Publications, Westwood, New Jersey, USA.

Antaya et al. "Preparation and Characterization of $LiCoO_2$ Thin Films by Laser Ablation Deposition", J. Electrochem. Soc., vol. 140, No. 3, Mar. 1993, pp. 575-578.

Fragnaud et al. "Characterization of sprayed and sputter deposited $LiCoO_2$ thin films for rechargeable microbatteries", J. Power Sources, 63 (1996), pp. 187-191.

Birke et al. "Materials for lithium thin-film batteries for application in silicon technology", Solid State Ionics, 93 (1997), pp. 1-15.

Benqlilou-Moudden et al. "Amorphous Lithium Cobalt and Nickel Oxides Thin Films Preparation and Characterization by RBS and PIGE", Thin Solid Films 333 (1998), pp. 16-19.

Jenson, Mark, U.S. Appl. No. 60/191,774, "Comprehensive patent for the fabrication of a high volume, low cost energy products such as solid state lithium ion rechargeable battery, supercapacitors and fuel cells", filed Mar. 24, 2000.

Jenson et al., U.S. Appl. No. 60/225,134, "Apparatus and method for rechargeable batteries and for making and using batteries", Aug. 14, 2000.

Jenson et al., U.S. Appl. No. 60/238,673, "Battery Having Ultrathin Electrolyte", filed Oct. 6, 2000.

\* cited by examiner

MANUFACTURING METHOD FOR THIN FILM BATTERY

BACKGROUND

Thin film batteries are used to supply energy in applications requiring a small size, high specific energy or density, or resistance to environmental degradation. Common applications include, for example, portable electronics, medical devices, and outer space systems. A thin film battery typically comprises a substrate that supports a stack of thin films that can include one or more of a current collector, cathode, anode and electrolyte, the thin films typically having a thickness of less than 100 microns. The thin films can be formed on the substrate by conventional fabrication processes, such as for example, physical or chemical vapor deposition (PVD or CVD), oxidation, nitridation, electron beam evaporation, and electroplating processes.

A lithium ion, thin film battery typically includes a cathode of a lithium-based material such as $LiCoO_x$, and in these batteries, increasing the thickness of this cathode film increases the energy density of the battery. The thicker cathode film provides greater charge retention and faster charging and discharging rates. For example, specific energy levels of at least 250 Whr/L can be achieved using a cathode film having a thickness of 5 microns or higher, as for example is taught in commonly assigned U.S. patent application Ser. No. 11/007,362 entitled "THIN FILM BATTERY AND METHOD OF MANUFACTURE" which is incorporated by reference herein, and in its entirety. The cathode film can be deposited as an amorphous or microcrystalline film in a single pass deposition process, and thereafter, crystallized by heating the film; or deposited in a sequence of thin films to form a thicker cathode comprising a stack of films.

However, conventional sputtering processes have several limitations, which include relatively slow cathode film deposition rates that make it economically difficult to manufacture thick cathode films. For example, conventional radio frequency magnetron sputtering processes often result in deposition rates of around 0.2 microns per hour. Increasing the sputter deposition rates can result in plasma arcing which affects the quality of deposited films. These processes also require an impedance matching network to match the impedance of magnetron and power supply to increase plasma stability and efficiency. However, it is also often difficult to identify the correct impedance matching parameters.

Thus it is desirable to have a process for depositing relatively thick cathode films in a short time to provide a battery having relatively higher energy density or specific energy. There is also a need for depositing such cathode films with decreased electrical contact resistances while still maintaining good deposition rates. There is further a need for depositing lithium cobalt oxide without arcing or impedance matching problems.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1A:
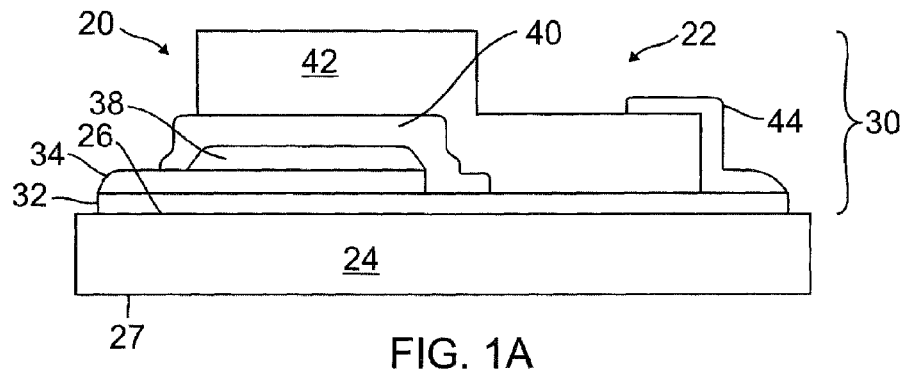
FIG. 1A is a sectional side view of an embodiment of a thin film battery comprising a battery cell on a substrate.

An embodiment of a thin film battery 20 comprising a single battery cell 22 enclosed on one side by the substrate 24, is illustrated in FIG. 1A. The battery 20 can also have single or multiple battery cells 22a,b on opposing surfaces of a substrate 24, as illustrated for example in FIG. 1B. A further embodiment of a battery 20 comprising a plurality of battery cells 22a-c on a planar surface 26 of a substrate 24 is illustrated in FIG. 2.

Referring back to FIG. 1A, the battery cell 22 comprises a plurality of battery component films 30. The battery component films 30 are typically formed on an adhesion layer 32 but can also be formed directly on the substrate 24. The battery component films 30 cooperate to form a battery capable of receiving, storing, and discharging electrical energy. The films 30 can be employed in a number of different arrangements, shapes, and sizes. The battery component films 30 includes at least a pair of electrode films on either side of an electrolyte film 40. The electrode films can include one or more of a cathode current collector film 34, a cathode film 38 an anode film 42, and an anode current collector film 44, which are all inter-replaceable. For example, the battery 20 can include (i) a pair of cathode and anode films or a pair of current collector films, (ii) both the anode/cathode films and the current collector films, or (iii) various combinations of these films, for example, a cathode film and an anode and anode current collector film but not a cathode current collector film, and so on. The exemplary versions of the battery 20 illustrated herein are provided to demonstrate features of the battery and to illustrate their processes of fabrication; however, it should be understood that these exemplary battery structures should not be used to limit the scope of the invention, and alternative battery structures as would be apparent to those of ordinary skill in the art are within the scope of the present invention.

Figure 1B:
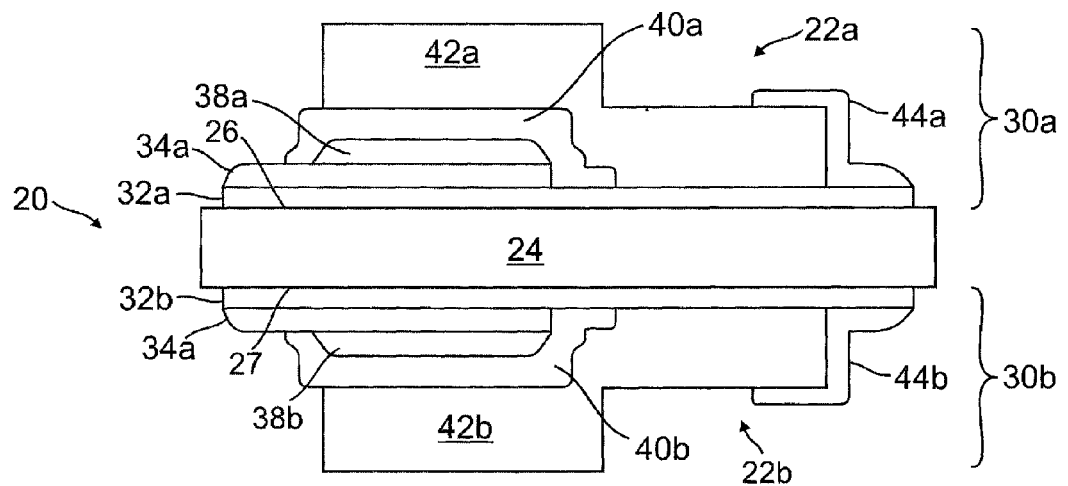
FIG. 1B is a sectional side view of another embodiment of a battery comprising a first battery cell on a first surface of a substrate and a second battery cell on a second surface.
Figure 2:
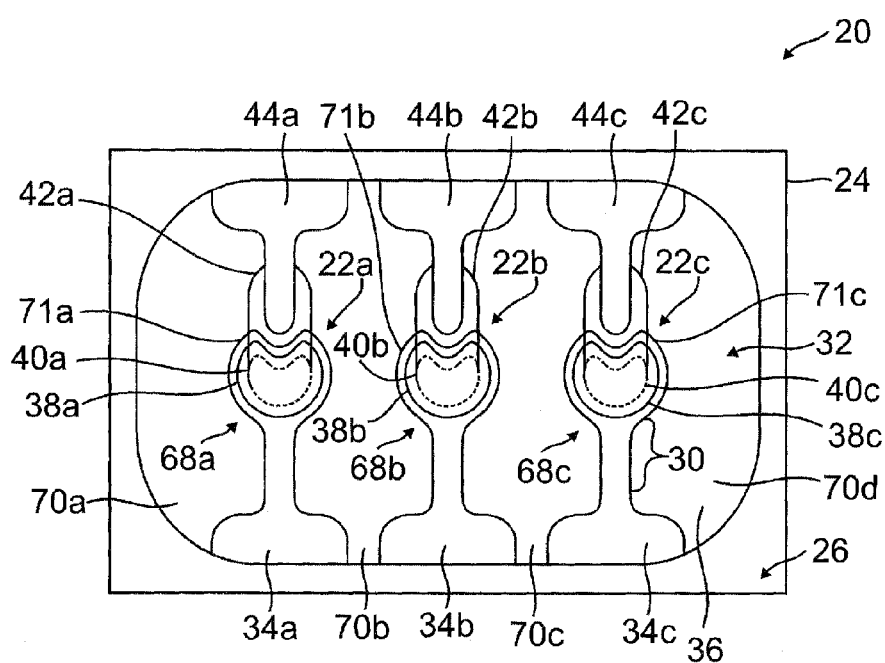
FIG. 2 is a top plan view of a thin film battery showing a plurality of battery cells on a single surface of the substrate.

Referring to FIG. 1B, the battery 20 can include a first battery cell 22a on a first planar surface 26 of the substrate 24, and a second battery cell 22b on a second planar surface 27 of the same substrate 24. Each battery cell 22a,b comprises a plurality of battery component films 30a,b that include one or more adhesion films 32a,b; first or cathode current collector films 34a,b; cathode films 38a,b; electrolyte films 40a,b; anode films 42a,b; and second or anode current collector films 44a,b. This version of the battery 20 with two opposing cells 22a,b can be formed using the same processes used to form the battery 20 with the single cell 22 (FIG. 1A), by flipping over the substrate 24 to form the battery film components 30b of the second battery cell 22b, during or after processing of the first battery cell 30a. Alternatively, the battery film components 30b of the second battery cell 22b can be formed simultaneously with the battery film components 30a of cell 22a, using chambers having multiple process zones, an exemplary version of which is described in copending U.S. patent application Ser. No. 11/681,754, filed Mar. 2, 2007, which is incorporated herein by reference and in it's entirety.

The battery component films 30 are formed on a battery substrate 24 to fabricate a battery 20 in several fabrication steps, which can be performed separately or as a combination of steps. In a first step, a suitable substrate 24 is selected, the substrate 24 being a dielectric having sufficient mechanical strength to support battery component films 30, and typically having a surface suitable for the deposition of thin films. Suitable substrates 24 can be made from, for example, ceramics such as aluminum oxide or silicon dioxide; metals such as titanium and stainless steel; semiconductors such as silicon; or even polymers. One desirable substrate comprises a crystalline sheet formed by cleaving the planes of a cleavable crystalline structure. The cleavable crystalline structure splits along definite planes to create flat surfaces, and can include (i) basal cleavage crystals having cleavage planes parallel to the base of a crystal or to the plane of the lateral axes; (ii) cubic cleavage crystals having cleavage planes parallel to the faces of a cube, (iii) diagonal cleavage crystals which has cleavage planes parallel to a diagonal plane; (iv) lateral cleavage crystals which have cleavage planes parallel to the lateral planes; (v) octahedral, dodecahedral, or rhombohedral cleavage crystals in which cleavage occurs parallel to the faces of an octahedron, dodecahedron, or rhombohedron (respectively); and (vi) prismatic cleavage crystals in which cleavage occurs parallel to a vertical prism. The crystalline cleaving structure can be, for example, mica or graphite. Mica can be split into thin crystal sheets having thicknesses of less than about 100 microns or even less than about 25 microns, as described in a U.S. Pat. No. 6,632,563 "THIN FILM BATERY AND METHOD OF MANUFACTURE", filed on Sep. 9, 2000, which is incorporated by reference herein and in its entirety. In one version, an array of substrates 24 that each comprise a mica sheet is used in the fabrication process. Each mica sheet can be a rectangle which is sized, for example, having dimensions from about 10 mm to about 200 mm.

The substrate 24 of mica or other materials, can optionally be annealed to temperatures sufficiently high to clean the deposition surface, such as the cleavage plane surface, by burning-off contaminants and impurities, such as organic materials, water, dust, and other materials formed or deposited on the planar surfaces 26, 27 of the substrate 24; or even heated to temperatures high enough to remove any water of crystallization present within the substrate. The annealing temperatures can be from about 150 to about 600° C., even at least about 400° C., or even at least about 540° C. The annealing process can be conducted in an oxygen-containing gas, such as oxygen or air, or other gas environments, for about 10 to about 120 minutes, for example, about 60 minutes. The cleaning process can also be conducted in an oxygen plasma containing cleaning step. Suitable annealing and other cleaning processes are described, for example, in U.S. patent application Ser. No. 11/681,754 which is incorporated by reference herein and in its entirety.

After the substrate cleaning and annealing step, a plurality of battery component films 30 are deposited on the surfaces 26, 27 of the substrate 24 to form battery cells 22 that can generate or store electrical charge. The component films 30 are typically formed using a PVD sputter deposition process, under controlled process conditions and in one or more sputtering chambers.

Figure 3A:
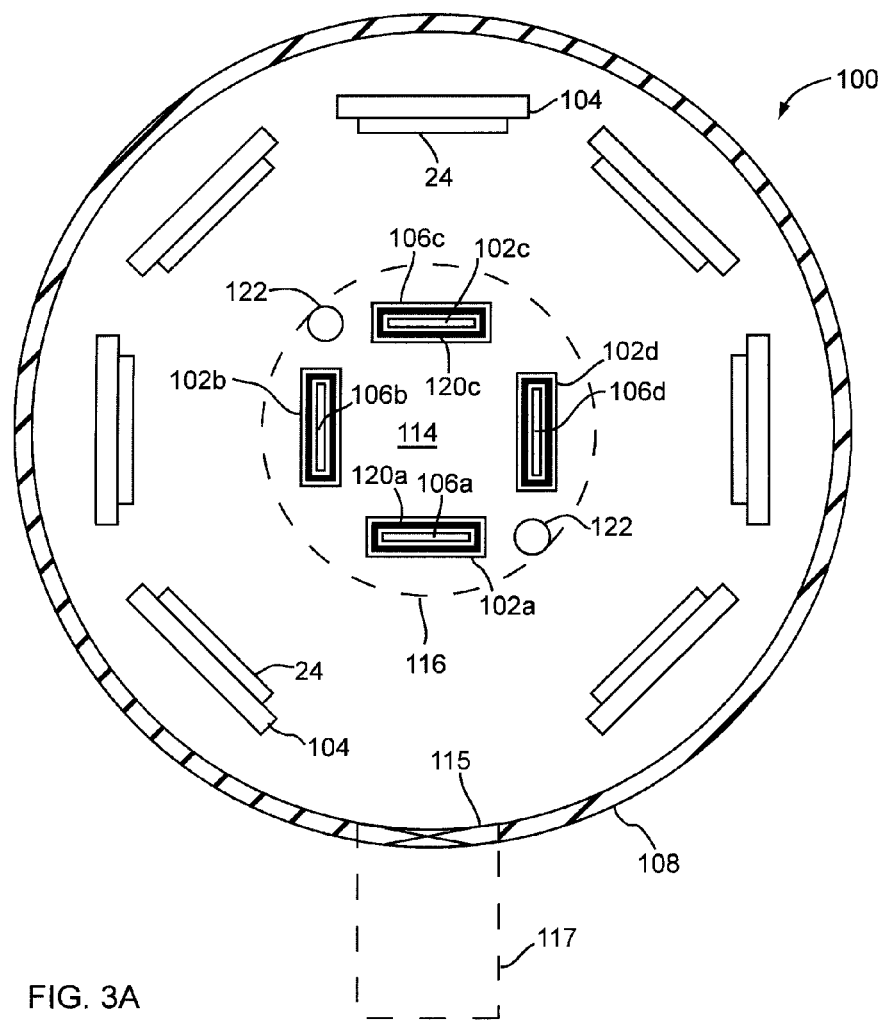
FIG. 3A is a top plan schematic view of an embodiment of a twin magnetron deposition chamber.
Figure 3B:
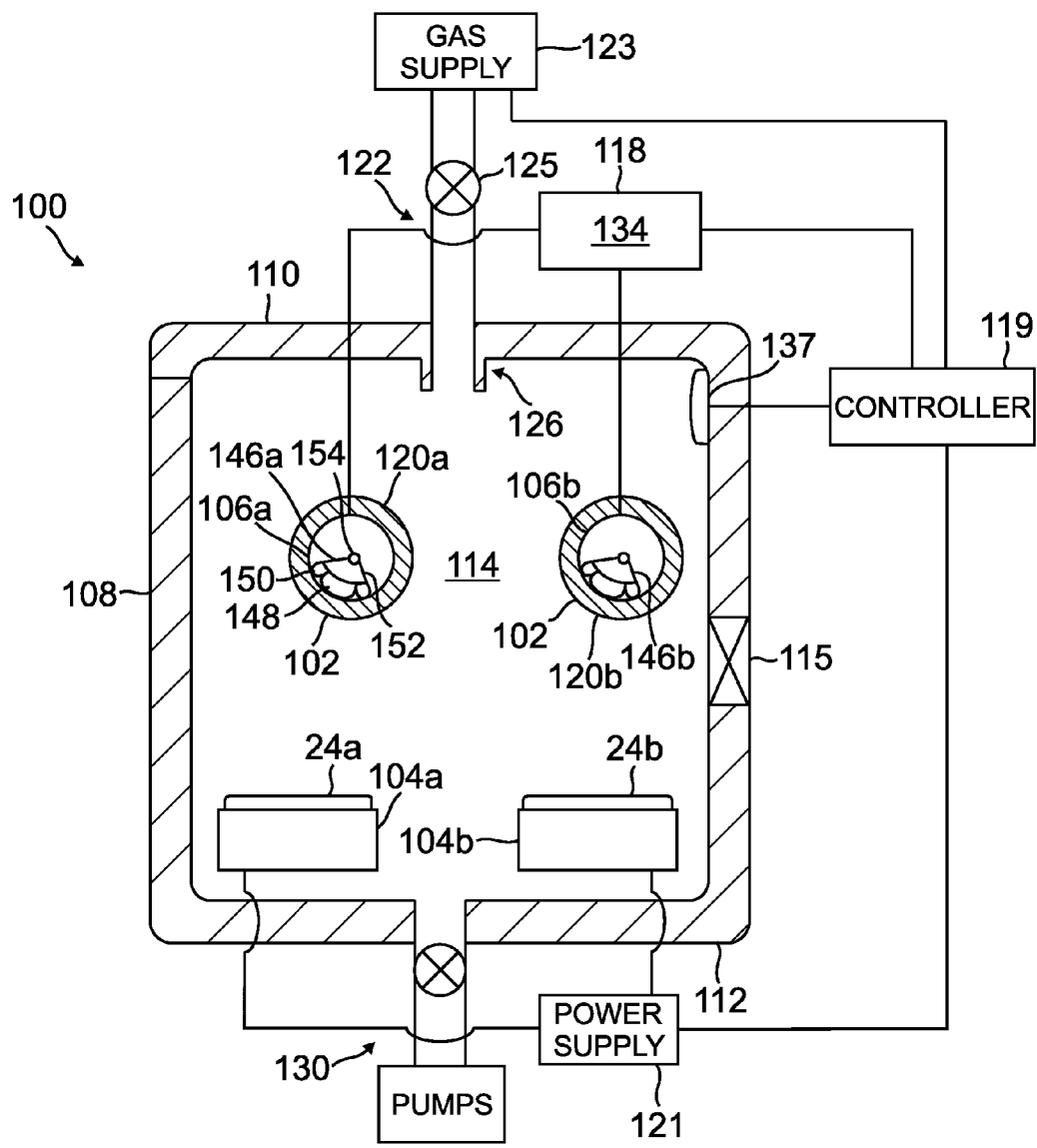
FIG. 3B is a sectional side schematic view of the twin magnetron deposition chamber of FIG. 3A.

In one exemplary fabrication method, one or more battery component films 30 are deposited onto the battery substrate 24 using a sputtering chamber 100, as shown, for example, in FIGS. 3A and 3B. The chamber 100 comprises a circular sidewall 108, a chamber ceiling 110 and a lower wall 112 which surrounds and encloses a process zone 114. The chamber sidewall 108 can be electrically isolated from the chamber ceiling 110 and the lower wall 112 and can even be electrically grounded. The chamber walls are typically composed of stainless steel, steel or aluminum. In one version, the sputtering chamber 100 is separated from a loading chamber by a slit valve 115 for passage and transport of substrates 24 into and out of the chamber 100. The slit valve 115 can lead to a dry box 117 for loading the substrates 24. Substrates 24 are placed onto a substrate holding fixture which is then carried into the sputtering chamber by a conveyer, the substrate holding fixture is electrically isolated from the chamber walls.

One or more substrate supports 104, or 104a,b, are positioned about the peripheral edge of the chamber 100 for receiving substrates 24. The substrate supports 104 or 104a,b are oriented to face inward and towards a radially inward region 116 of the chamber 100. In one version, the substrate supports 104 can be moved during sputter processing, thereby allowing the substrates 24 to be rotated about the periphery of the sputtering chamber 100 or even around a circumference that encloses the plurality of sputtering targets 102 a-d. Rotation of the substrates 24 during processing increases the deposition uniformity. In a further version, the substrate supports 104 is electrically isolated from the chamber sidewall 108 and sputtering targets 102. The substrate supports 104 can be biased at a negative voltage relative to the plasma, or even relative to the time averaged potential of the cathodes. The negatively biased substrate support 104 serves to attract the positively charged ions and sputtered material from the plasma zone 114. In one version the substrate supports 104 are biased by a biasing power supply. The biasing power supply provides a pulsed DC voltage bias of from about −5 to about −200 V or even about −40 V between the substrate supports 104 and the radially inward region 116 of the chamber 100. The pulsed biasing voltage has a duty cycle of from about 10% to about 90%, or even about 30%. The substrate support 104 can also include a heater and heating control circuitry to maintain the substrate 24 at an appropriate processing temperature. In one version the substrate 24 is maintained at a temperature of from about 50 to about 200° C. during processing.

A plurality of sputtering targets 102 are mounted in the radially inward region 116 of the chamber 100. The sputtering targets 102 can comprise lithium metal oxide, such as for example, lithium cobalt oxide, lithium nickel oxide, lithium manganese oxide, lithium iron oxide, or even lithium oxides comprising mixtures of transition metals such as for example, lithium cobalt nickel oxide. The sputtered target material deposits onto a plurality of battery substrates 24 in the chamber. The targets 102 comprises an even number of targets such as for example two, four, six or even ten or more targets. In one version, the number of targets 102 and the size of the chamber 100 is scaleable to accommodate a larger batch of substrates 24 for processing. The sputtering targets 102 can be rectangular or cylindrical. The cylindrically shaped targets are mounted to cylindrically shaped magnetrons 106. These magnetrons 106 can be configured to self-rotate during the deposition process, exposing fresh sputtering surface and reducing localized heating of the attached targets 102, thereby increasing the target lifespan, in on-time plasma hours, by from 15% to 70%.

One or more magnetrons 106 are provided in the radially inward region 116 of the chamber 100. The magnetrons 106 are capable of generating a time varying magnetic field at a particular location in the chamber 100. Each magnetron 106 comprises a set of rotatable magnets or electromagnets. The magnetron 106 can be a single structure or a set of structures. In one version, the magnetron 106 includes a first rotatable magnet assembly 146a which is rotated behind a backside surface of a first sputtering target 102a, and a second rotatable magnet assembly 146b which is rotated behind the backside surface of a second sputtering target 102b.

The rotatable magnet assembly comprises a magnet that is capable of being rotated about a central axis. In the version shown in FIG. 3B a first magnet 148 having a first magnetic flux or magnetic field orientation, and one or more peripheral magnets 150 having a second magnetic flux or magnetic field orientation are mounted to a support plate 152. The support plate 152 is rotated by an axle 154 that is powered by a motor (not shown). In one version, the ratio of the first magnetic flux to the second magnetic flux is at least about 1:2, for example, from about 1:3 to about 1:8, or even about 1:5. This allows the magnetic field from the peripheral magnets 150 to extend deeper into the chamber 100. For example, the second magnetic field orientation can be generated by positioning the peripheral magnets 150 so that their polarity direction is opposite to the polarity direction of the central magnets 150. In one embodiment, the first and second rotatable magnet assemblies 146a,b are rotated at a rotational frequency of between about 0.005 and about 0.1 Hz, whereby a time varying magnetic field is provided about the surface of the first and second targets 102.

The magnetron 106 can also be connected to an AC power source 118 that provides an alternating voltage to excite the sputtering gas within the chamber 100. When the chamber comprises twin magnetrons 106a,b, the power source 118 serves to bias the twin magnetrons 106a,b relative to each other. For example, when the first magnetron 106a is on a negative potential relative to the second magnetron 106b, the first magnetron 106a acts as the sputtering cathode, while the second magnetron 106b acts as an anode. In the present example, the magnetrons 106 are powered with an AC voltage that is between 200V and 1200V and has a power of between 1 kW and 20 kW. During processing the momentary cathode generates secondary electrons which are accelerated towards the anode and neutralize positive surface charges having been built up in insulating areas during the negative half cycle. The magnetrons 106 can be mounted to the chamber ceiling 110 or lower wall 112. Typically, a sputtering target is attached to each magnetron 106. The magnetron 106 transmits the voltage to the attached sputtering target 102, and the sputtering gas between the AC biased targets 102 is excited. In one version, the chamber 100 comprises twin magnetrons which are each connected to a target 102.

In one embodiment, twin magnetrons 106a,b are operated by a voltage or current maintained at a mid-frequency level, which is a frequency of from about 10 to about 100 kHz. It has been found that the mid-frequency sputtering process desirably reduces or eliminates co-excitation modes that would otherwise occur between the twin magnetrons 106. Absence of the co-excitation mode results in reduced arcing of the sputtering targets 102, thereby increasing the lifespan of the targets 102, and also improving the quality of the deposited films. Arcing is often initiated by electrical breakdown of the insulating layer on the magnetron cathode. However, application of a mid-frequency power from a mid-frequency AC power source 118 to a twin-magnetron arrangement, reduces charging up of the insulating layer and resultant plasma process instabilities. For targets 102 comprising lithium cobalt oxide, sputtered films can be produced in this manner without arcing over almost the entire lifetime of the target 102. Thus higher power levels can be applied to the sputtering targets 102. As a result, the deposition process is more continuous and results in high quality films and higher deposition throughput. For example, the mid-frequency dual magnetron process provides a deposition rate of from about 0.2 to about 4 microns/hour.

The chamber 100 also has a plurality of cathodes 120, as shown for example in FIGS. 3A and 3B. Each cathode 120 is formed by binding a target 102 to a magnetron 106, which provides an unbalanced magnetic field about the surface of the target 102 and results in a more continuous bombardment of the target during sputtering.

The chamber 100 can further include a plurality of ion sources 122 that are capable of supplying ionized gas for in-situ active cleaning and activation of the substrates 24. In the embodiment shown in FIG. 3A, the ion sources 122 are located adjacent to the targets 102. For example, the ion sources 122 can be located within a radially inward region 116 of the chamber 100, or even between the targets 102. During the cleaning process, a cleaning gas is provided to the chamber 100 such as for example, argon and oxygen. A voltage is supplied between the radially inward region of the chamber 116 and the substrate supports 104, such that the cleaning gas ions are drawn towards and bombard the surface of the substrate 24. Typical ion-source cleaning processes are erosive to, and can decrease the lifespan of, the sputtering target 102. In one embodiment, a fixture (not shown) covering half of the surface of a target 102 can be rotated to first and second orientations within the chamber 100. In the first orientation, the exposed part of the targets 102 face the substrates 24 for film deposition and in the second orientation, the exposed part of the targets 102 faces the center for in-situ active substrate cleaning, thereby decreasing target contamination.

The chamber 100 is connected to a gas supply 123, gas distributor 126 and gas exhaust 130, which supply and control the pressure and concentration of process gas within the chamber 100. The process gas mixture is controlled by first evacuating the chamber 100 and then introducing controlled amounts of process gas into the chamber 100. In one version the chamber 100 is evacuated to a pressure of less than about $5 \times 10^{-5}$ Torr or even less than about $2 \times 10^{-5}$ Torr prior to introduction of the sputtering gas. Sputtering process gas is introduced into the chamber and maintained at a pressure of from about 1.1 to about 15 mTorr. In one version the sputtering gas comprises argon and oxygen. The argon provides stable plasma and oxygen can prevent oxygen loss in the targets or the deposited films during the process. The sputtering argon gas is maintained in the chamber 100 at a pressure of from about 1 to about 10 mTorr. The sputtering oxygen gas is maintained in the chamber 100 at a pressure of from about 0.1 to about 5 mTorr.

The twin magnetrons are connected to a power source 118, such as for example, an AC power supply 134. The AC power supply 134 and provides an alternating voltage having a wave form that is approximately sinusoidal and that has a frequency in the mid-frequency range of between about 10 and about 100 kHz, or even about 40 kHz. During processing, the power supply 134 energizes the process gas by applying a voltage bias across the first and second magnetrons 106a,b at a frequency of from about 10 to about 100 kHz, or even from about 20 to about 80 kHz. The voltage bias can also be applied at a power level of at least about 1 kW, or even at a power level of from about 3 kW to about 20 kW. In one exemplary process, the power supply 134 supplies a power density to the surface of the targets 102 that is at least 0.1 W/cm$^2$ or even between about 0.1 W/cm$^2$ and about 20 W/cm$^2$.

The chamber 100 is controlled by a controller 119 that comprises program code having instruction sets to operate components of the chamber 100 to process substrates 24 in the chamber 100. For example, the controller 119 can comprise a substrate positioning instruction set to operate a substrate transport mechanism to position a substrate 24 in the chamber 100; a gas flow control instruction set to operate the flow control valves 125 to set a flow of gas to the chamber 100; a gas pressure control instruction set to operate the exhaust 130 to maintain a pressure in the chamber 100; power supply control instruction sets such as a gas energizer control instruction set to operate the electrode power supply 134 to set a gas energizing power level and a DC power supply control instruction set to operate a DC power supply 121 to provide a DC voltage bias to the substrate support 104; a temperature control instruction set to control temperatures in the chamber 100; and a process monitoring instruction set to monitor the process in the chamber 100, for example by monitoring temperatures or pressure via one or more sensors 137 that are within the chamber.

The mid-frequency twin magnetron sputtering process is particularly efficient at deposition of lithium cobalt oxide films and can provide deposition rates of between 0.2 and 4 microns per hour. The sputtering rate is sensitive to adjustments in power, processing gas pressure and DC bias voltage. In one exemplary process, two or four $LiCoO_2$ targets are installed in the chamber. The substrate is placed in the chamber which is pumped down to below $5\times10^{-5}$ Torr. A suitable substrate 24 comprises a 35 mm×62 mm sheet of mica. Process gas, such as for example, argon and oxygen, are introduced into the chamber 100 to serve as the sputtering gas. The sputtering gas comprising argon is maintained in the chamber 100 at a pressure from about 1 to about 10 mtorr and in one version about 2 mTorr, and oxygen is maintained at the pressure of from 0.1 to 5 mTorr and in one version about 0.75 mTorr. Sputtering is performed by applying an 0.1 to 20 $W/cm^2$ power density to each target 102 and a pulsed DC voltage bias of between −5 and −100 V or even about −40 V between the substrate supports 104 and the radially inward region 116 of the chamber 100. The duty cycle is between 10% and 90%, even at 30%. The substrate 24 is maintained at a temperature of from about 50 to about 200° C. during processing. In one version the voltage bias is applied for a sufficient time to deposit a lithium cobalt oxide film having a thickness of from about 0.25 to about 0.75 of the total thickness of a stack of films formed on the substrate 24.

The deposition rates obtained from the mid-frequency twin magnetron process were found to be higher than the deposition rates obtained by conventional sputtering processes, as illustrated by the following examples:

Example I

Four $LiCoO_2$ targets were installed in the chamber 100 a mica substrate was placed in the chamber onto a substrate support 104 in the chamber 100. The chamber 100 was pumped down to $2\times10^{-5}$ Torr prior to introduction of the sputtering gas. Sputtering gas comprising argon and oxygen were introduced into the chamber 100. The argon gas was maintained in the chamber 100 at a pressure of about 8.2 mTorr and the oxygen gas was maintained in the chamber 100 at a pressure of about 0.75 mTorr. Sputtering was performed by applying an oscillating voltage bias between the targets, the oscillation having a frequency of about 40 kHz. The power applied to each pair of targets was about 3 kW, and with a density of about 3.5 $W/cm^2$. A pulsed DC voltage bias of about −40 V was applied between the substrate support 104 and the radially inward region 116 of the chamber 100 with a duty cycle of about 30%. The substrate 24 was maintained at a temperature of about 120° C. during processing. The as-deposited lithium cobalt oxide film had a thickness of 3.5 microns after 5 hours deposition. The deposition rate was found to be about 0.7 microns per hour. The volume deposition rate per kilowatt hour was about 0.050 $cm^3/kW.hr$.

Example II

For comparison, a conventional RF sputtering process and deposition rate for lithium cobalt oxide film with a single magnetron chamber are presented.

A single $LiCoO_2$ target was installed in the chamber and a substrate was placed onto a substrate support in the chamber. The chamber was pumped down to $1\times10^{-5}$ Torr prior to introducing the sputtering gas. A process gas comprising argon and oxygen were introduced into the chamber. The argon gas was maintained in the chamber at a pressure of about 8.2 mtorr and the oxygen gas was maintained in the chamber at a pressure of about 0.75 mTorr. Sputtering was performed by applying an oscillating voltage bias to the target, with a frequency of about 13.5 MHz. A power density of 1.8 $W/cm^2$ was thereby applied to the target. The substrate 24 was maintained at a temperature of about 120° C. during processing. The as-deposited lithium cobalt oxide film had a thickness of 2 microns after 5 hours deposition. The deposition rate of the conventional RF system was found to be about 0.4 microns/hr. The volume deposition rate per kilowatt hour was about 0.016 $cm^3/kW.hr$. In addition, the RF deposition process was limited in the amount of power that could be applied to the target because the system was prone to arcing at higher power densities.

As supported in the examples above, the volume deposition rate per kilowatt hour of the dual-magnetron mid-frequency process was found to be 3.1 times higher than the volume deposition rate per kilowatt hour of the RF process.

The deposited film can be annealed to reduce or even eliminate point defects in the crystal lattice by heating the substrate 24 to a temperature that is sufficient for annealing for example, to a temperature of from about 200 to about 500° C. The substrate 24 can be annealed in-situ by direct heating from a temperature controlled substrate support 104 or by radiation heating from an infrared radiation source (not shown). In another embodiment, the substrate 24 is removed and annealed in a separate chamber or even outside the chamber environment.

Unexpectedly and surprisingly, $LiCoO_x$ films deposited using a mid-frequency, dual magnetron process were found to anneal sufficiently well at a temperature of only about 400° C., as compared to a previous anneal temperature of about 540° C. for the conventionally deposited film. It is believed that this reduction in the temperature of annealing is because the as-deposited film contains fewer lattice defects. The reduction in lattice defects may be caused by a higher plasma density during the mid-frequency twin-magnetron deposition process, which may break down the sputtered material into smaller pieces.

Example III

Figure 4A:
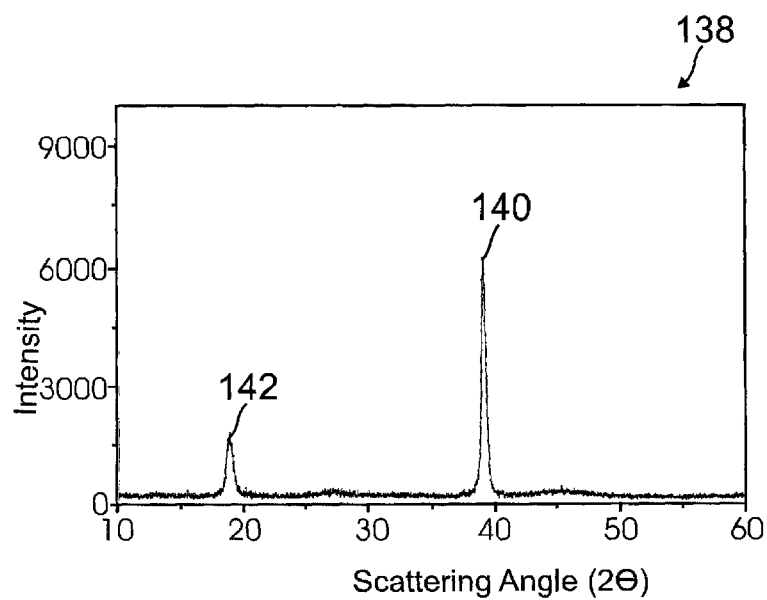
FIGS. 4A and 4B are plots of the X-ray diffraction pattern of a deposited lithium cobalt oxide film before and after annealing, respectively.

A $LiCoO_x$ film fabricated according to the present method and without an additional annealing step comprises $LiCoO_2$ which is crystalline with a strong (012) preferred orientation and with a smaller amount of (003) oriented grains. FIG. 4A shows a typical x-ray two theta diffraction pattern 138 of the as-deposited $LiCoO_2$ film. The large peak 140, located at a scattering angle of about 39°, and the smaller peak 142, located at a scattering angle of about 19°, show that the film is highly crystalline and with a (012) and (003) preferred orientation. The substrate was slightly tilted when taking x-ray diffraction in order to suppress the diffraction peaks from an underlying mica substrate to better reveal the crystalline properties of the $LiCoO_2$ film. It is believed that the crystalline material was deposited due to a combination of plasma heating, oxygen activation and plasma enhanced nucleation and growth processes. The as deposited crystalline material was a good cathode material.

Example IV

Figure 4B:
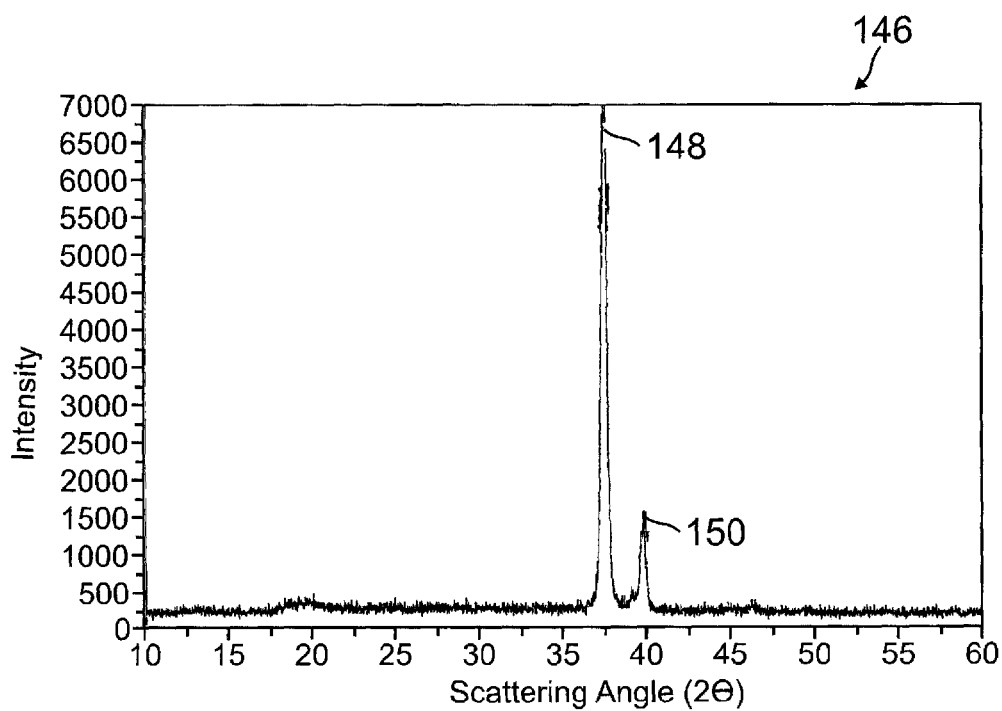

Optionally, the film formed on the substrate may be annealed at 150 to 600° C. to further improve the quality of the cathode film. An x-ray diffraction pattern 136 of crystalline $LiCoO_2$ film after annealing at 400° C. for 10 hours is shown in FIG. 4B. The larger intensity peak 148, located at a scattering angle of about 37.5° shows a strong (101) preferred orientation and the smaller intensity peak 150, located at a scattering angle of about 40° shows a small amount of (012) oriented grains. The annealing step was found to increase the battery capacity by 10 to 20%, increase the charge and discharge current by more than 50%, and improve the resistance to moisture. It is believed that these attributes arise from the elimination of point defects and the reduction of electrical contact resistances in the cathode material.

Example V

Figure 5:
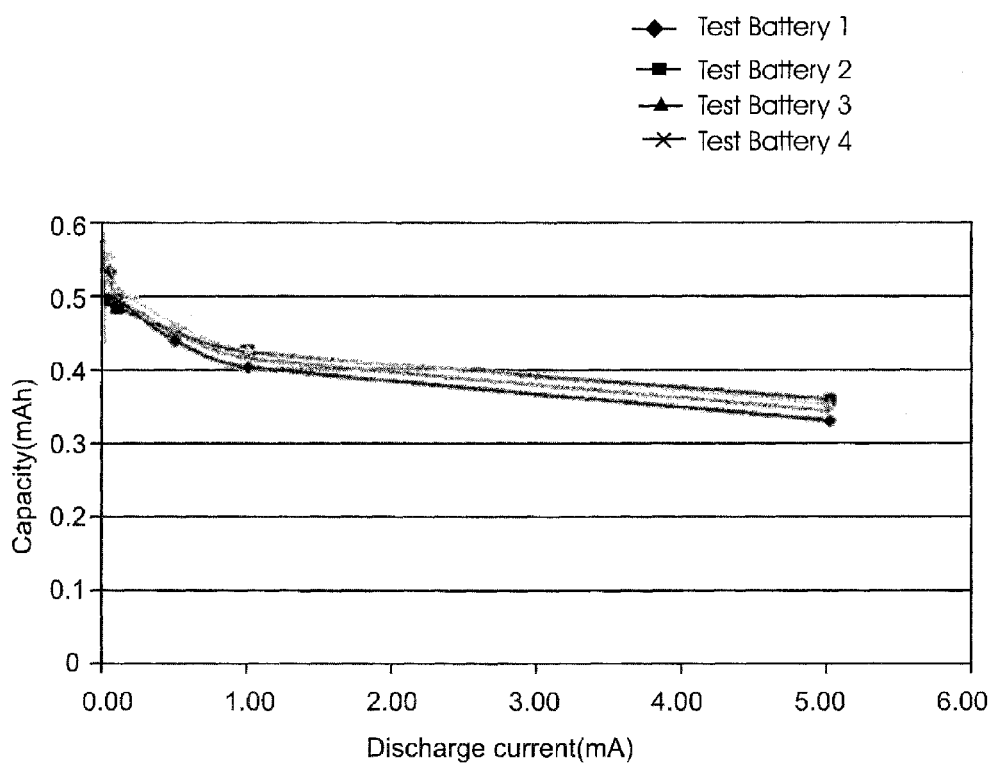
FIG. 5 is a plot of the energy capacity versus current for an embodiment of a thin film battery.

In one version, the area of the battery is 2.9 cm². The mica substrate is 20 microns thick, and overall thickness of the battery is around 50 microns. The battery is sealed with Surlyn (epoxy) for temporary protection against the oxidizing environment. FIG. 5 shows the discharge curves of four test batteries, each comprising a $LiCoO_x$ film deposited by the method described above (with 400° C. annealing). The curves indicate that the higher the discharge current, the lower the capacity, which is consistent with previous data obtained from $LiCoO_x$ film batteries formed using an RF deposition process. This Surlyn sealed battery has an energy density of around 62.4 wh/l.

While a particular sequence of process steps is described to illustrate an embodiment of the process, it should be understood that other sequences of process steps can also be used as would be apparent to one of ordinary skill in the art.

The above methods or other deposition methods can be used to deposit one or more of the component films 30, which in one embodiment include an adhesion film 32. The adhesion film 32 is deposited on the planar surface 26 of the substrate 24 to improve adhesion of overlying battery component films 30 (FIG. 1A). The adhesion film 32 can comprise a metal or metal compound, such as for example, aluminum, cobalt, titanium, other metals, or their alloys or compounds thereof; or a ceramic oxide such as, for example, lithium cobalt oxide. Exemplary process conditions for deposition of a titanium adhesion film 32 comprise: argon maintained at a pressure of 2 mTorr; DC (direct current) sputtering plasma at a power level of 1 kW, a deposition time of 30 seconds, a titanium target size of 5×20 inches, and a target-to-substrate distance of 10 cm. In the version shown in FIG. 1B, after deposition of a first adhesion film 32a on the first planar surface 26 of the substrate 24, the substrate 24 is flipped over and a second adhesion film 32b is deposited on the second planar surface 27 which forms the other side of the substrate. The adhesion film 32 can be deposited on the substrate 24 not only to cover the area under the subsequently deposited battery cells 22a-c and their battery component films 30 but also the area 36 extending beyond the battery component films 30, as described in aforementioned U.S. patent application Ser. No. 11/681,754. The adhesion film 32 is typically deposited in a thickness of from about 100 to about 1500 angstroms.

A cathode current collector film 34 is formed on the adhesion film 32 to collect the electrons during charge and discharge process. The cathode current collector film 34 typically comprises a conductor such as, for example, aluminum, platinum, silver or gold or even the same metal as the adhesion film 32 in a thickness that is sufficient to provide the desired electrical conductivity. The first current collector film 34 typically has a thickness that is from about 0.05 microns to about 2 microns. The cathode current collector film 34a-c can be formed as a pattern of features 68a-c, as illustrated in FIG. 2, that each comprise a spaced apart discontinuous region that covers a small region of the adhesion film 32. The features 68a-c are over the covered regions 71a-c of the adhesion film 32, and adjacent to the features 68a-c are exposed regions 70a-c of the adhesion film 32. To deposit the patterned film 34a-c, a patterned mechanical mask is placed on top of the substrate 24, and a first current collector film 34 of platinum is deposited by DC magnetron sputtering to form the features 68a-c between the patterned mask regions. Exemplary process conditions for argon sputter deposition of a platinum cathode current collector film 34a-c comprise a gas pressure of 5 mTorr to form a DC plasma at a power level of 40 Watts for 10 minutes.

After forming the features 68a-c on the adhesion film 32, the adhesion film with its covered regions 71a-c below the patterned features 68a-c and exposed surface regions 70a-d, is then exposed to an oxygen-containing environment and heated to temperatures of from about 200° C. to about 600° C., for example, about 400° C., for about an hour, to oxidize the exposed regions 70a-d of titanium that surround the deposited platinum features but not the titanium regions covered and protected by the platinum features. The resultant structure, advantageously, includes not only the non-exposed covered regions 71a-c of adhesion film 32 below the features 68a-c of the current collector film 38, but also oxygen-exposed or oxidized regions 70a-d which form non-conducting regions that electrically separate the plurality of battery cells 22a-c formed on the same substrate 24.

A cathode film 38 comprising an electroactive material is then formed over the current collector film 34. In one version, the cathode film 38 is composed of lithium metal oxide, such as for example, lithium cobalt oxide, lithium nickel oxide, lithium manganese oxide, lithium iron oxide, or even lithium oxides comprising mixtures of transition metals such as for example, lithium cobalt nickel oxide. Other types of cathode films 38 that may be used comprise amorphous vanadium pentoxide, crystalline $V_2O_5$ or $TiS_2$. In one example, the cathode film 38 comprises crystalline lithium cobalt oxide, which in one version, has the stoichiometric formula of $LiCoO_2$. The cathode film 38 can be fabricated in a single continuous deposition step or using a multiple sequential deposition and stress reducing annealing step that is performed at a temperature of between about 150 and 600° C. Typically, the cathode film 38 or cathode film stack has a thickness of at least about 5 microns, or even at least about 10 microns. In one exemplary embodiment, the cathode film 38 is deposited using a twin-magnetron, mid-frequency sputtering process, as described above. The twin-magnetron mid-frequency process is particularly well suited for deposition of the cathode film 38 because of it's comparatively high sputtering rates for lithium metal oxides. The cathode film 38 can also be annealed in a defect reducing step to temperatures of from about 150 to about 700° C., for example, by about 400° C., to further improve the quality of the cathode film 38 by reducing the amount of defects.

An electrolyte film 40 is formed over the cathode film 38. The electrolyte film 40 can be, for example, an amorphous lithium phosphorus oxynitride film, also known as a LiPON film. In one embodiment, the LiPON has the stoichiometric form $Li_xPO_yN_z$ in an x:y:z ratio of about 2.9:3.3:0.46. In one version, the electrolyte film 40 has a thickness of from about 0.1 micron to about 5 microns. This thickness is suitably large to provide sufficiently high ionic conductivity and suitably small to reduce ionic pathways to minimize electrical resistance and reduce stress.

An anode film 42 formed over the electrolyte film 40. The anode film 42 can be the same material as the cathode film 38, as already described. A suitable thickness is from about 0.1 micron to about 20 microns. In one version, anode film 42 is made from lithium which is also sufficiently conductive to also serve as the anode current collector film, and in this version the anode film 42 and anode current collector film 44 are the same. In another version, the anode current collector film 44 is formed on the anode film 42, and comprises the same material as the cathode current collector film 34 to provide a conducting surface from which electrons may be dissipated or collected from the anode film 42. For example, in one version, the anode current collector film 44 comprises a non-reactive metal such as silver, gold, platinum, in a thicknesses of from about 0.05 microns to about 5 microns.

After the deposition of all the battery component films 30, a variety of protective layers or electrically conducting layers can be formed over the battery component films 30 to provide protection against environmental elements. In one example, the protective layer comprises a plurality of polymer and ceramic layers that are superimposed on each other. In another example, a portion of the cathode current collector film 34 or anode current collector film 44 that extends out from under a battery cell 22 forms a contact portion that is used to connect the battery cell 22 or the battery 20 to the external environment. This contact portion is coated with an electrically conducting barrier layer. The layers can protect the battery cell 22 during pulsed laser cutting of the individual battery cells from an array of cells formed on a larger mica substrate. For example, the electrically conducting barrier layer is formed in a thickness sufficiently large to prevent the pulsed laser beam from penetrating therethrough.

The thin film battery 20 can also be fabricated to provide a plurality of battery cells 22a-c on a single substrate 24. The battery cells 22a-c can be arranged horizontally across a single substrate surface 26 or fabricated on the front surface 26 and backside surface 27 of a battery substrate 24 to substantially increase the energy density and capacity of the battery cell 22. Suitable battery configurations, protective layers, and packaging, are described in for example, U.S. patent application Ser. No. 11/090,408, filed on Mar. 25, 2005, entitled "THIN FILM BATTERY WITH PROTECTIVE PACKAGING" by Krasnov et al., which is incorporated by reference herein and in its entirety.

While a particular sequence of process steps and chamber configuration is described to illustrate an embodiment of the process, it should be understood that other sequences of process steps can also be used as would be apparent to one of ordinary skill in the art. For example the order of deposition of the component films 30 can be interchanged or other films can be deposited on top of or in between films of the battery 20. Also, other configurations of the chamber 100 are possible for example the chamber can have more pairs of cathodes 120, such as 3, 4, or more. Therefore, the spirit and scope of the appended claims should not be limited to the description of the preferred versions contained herein.

What is claimed is:

1. A method of depositing a lithium cobalt oxide film on a battery substrate in a sputtering chamber comprising (i) a substrate support, (ii) first and second sputtering targets, (iii) a first electrode contacting the backside surface of the first sputtering target and a second electrode contacting the backside surface of the second sputtering target, and (iv) a first magnetron comprising a first rotatable magnet assembly behind the first sputtering target and a second magnetron comprising a second rotatable magnet assembly behind the second sputtering target, the method comprising:
(a) placing an array of substrates on the substrate support;
(b) providing first and second sputtering targets in the sputtering chamber, the first and second sputtering targets each consisting of lithium metal oxide;
(c) maintaining a sputtering gas at a pressure in the sputtering chamber;
(d) energizing the sputtering gas by applying an alternating voltage from an AC power supply to the first and second electrodes at a frequency of between about 10 and about 100 kHz such that each of the first and second electrodes alternately serves as an anode or a cathode; and
(e) rotating the first and second rotatable magnet assemblies at a rotational frequency of between about 0.005 and about 0.1 Hz to provide a variable magnetic field about the first and second sputtering targets.

2. A method according to claim 1 wherein the substrate support is electrically isolated from a wall of the sputtering chamber and from the first and second sputtering targets.

3. A method according to claim 2 wherein the substrate support is powered by a biasing power supply that provides a pulsed biasing voltage.

4. A method according to claim 3 wherein the pulsed biasing voltage is from about −20V to about −200V.

5. A method according to claim 3 wherein the pulsed biasing voltage has a duty cycle from 10% to 90%.

6. A method according to claim 1 where the lithium metal oxide is lithium cobalt oxide.

7. A method according to claim 1 wherein (a) comprises evacuating the sputtering chamber to maintain a pressure of less than about $5 \times 10^{-5}$ Torr.

8. A method according to claim 1 wherein the sputtering gas is argon.

9. A method according claim 1 wherein the sputtering gas comprises oxygen.

10. A method according to claim 1 wherein (a) comprises providing a plurality of substrates that each comprise a mica sheet.

11. A method according claim 1 further comprising depositing a plurality of battery component films on the substrate before or after steps (a) through (e) the films cooperating to form a battery, and the films comprising a current collector and electrolyte, and such that the deposited lithium metal oxide film serves as an cathode.

12. A method according to claim 1 wherein the alternating voltage is applied at a frequency of from about 20 to about 80 kHz.

13. A method according to claim 12 wherein the alternating voltage is applied at a power level of from about 3 kW to about 10 kW.

14. A method according claim 1 wherein the sputtering gas comprises argon and oxygen.

15. A method according claim 14 wherein the argon is maintained at a pressure of from about $1\times10^{-3}$ to about $1\times10^{-2}$ Torr.

16. A method according claim 14 wherein the oxygen is maintained at a pressure of from about $1\times10^{-4}$ to about $5\times10^{-3}$ Torr.

* * * * *